(12) United States Patent
Cok et al.

(10) Patent No.: US 8,115,380 B2
(45) Date of Patent: Feb. 14, 2012

(54) DISPLAY DEVICE WITH CHIPLETS

(75) Inventors: Ronald S. Cok, Rochester, NY (US);
John W. Hamer, Rochester, NY (US);
Dustin L. Winters, Webster, NY (US)

(73) Assignee: Global OLED Technology LLC, Herndon, VA (US)

( * ) Notice: Subject to any disclaimer, the term of this patent is extended or adjusted under 35 U.S.C. 154(b) by 842 days.

(21) Appl. No.: 12/191,462

(22) Filed: Aug. 14, 2008

(65) Prior Publication Data
US 2010/0039357 A1    Feb. 18, 2010

(51) Int. Cl.
*H01J 1/62* (2006.01)
(52) U.S. Cl. ......................................... 313/505; 313/506
(58) Field of Classification Search .......... 313/504–506, 313/509, 512
See application file for complete search history.

(56) References Cited

U.S. PATENT DOCUMENTS

| | | | |
|---|---|---|---|
| 4,769,292 | A | 9/1988 | Tang et al. |
| 5,061,569 | A | 10/1991 | Vanslyke et al. |
| 6,384,529 | B2 | 5/2002 | Tang et al. |
| 6,919,681 | B2 | 7/2005 | Cok et al. |
| 6,987,355 | B2 | 1/2006 | Cok |
| 7,169,652 | B2 | 1/2007 | Kimura et al. |
| 7,230,594 | B2 | 6/2007 | Miller et al. |
| 2003/0176069 | A1 | 9/2003 | Yuasa et al. |
| 2006/0055864 | A1 | 3/2006 | Matsumura et al. |
| 2007/0032089 | A1 | 2/2007 | Nuzzo et al. |
| 2007/0057263 | A1 | 3/2007 | Kahen |
| 2007/0141809 | A1 | 6/2007 | Ponza et al. |
| 2008/0157235 | A1 | 7/2008 | Rogers et al. |

FOREIGN PATENT DOCUMENTS

WO    WO 00/49658 A    8/2000

OTHER PUBLICATIONS

PCT Preliminary Report on Patentability in PCT counterpart application (mailed Feb. 24, 2011).
3.4: Invited Paper: A novel use of MEMS Switches in Driving AMOLED, Jun-Bo yoon, Jeong Oen Lee, Hyun-Ho yang, and Weon Wi Jang, Dept. of Electrical Engineering, KAIST, Daejeon 305-701, Korea, SID 08 Digest, pp. 13-16.
U.S. Appl. No. 11/145,574, entitled Methods and Devices for Fabricating and Assembling Printable Semiconductor Elements.
U.S. Appl. No. 11/423,192, entitled Pattern Transfer Printing by Kinetic Control of Adhesion to an Elastomeric Stamp.

*Primary Examiner* — Vip Patel
(74) *Attorney, Agent, or Firm* — Morgan, Lewis & Bockius LLP

(57) ABSTRACT

A display device includes: a substrate; one or more pixels arranged on the substrate, each pixel including a control electrode; a wiring layer located over the substrate, the wiring layer having a continuous line and a discontinuous pass-thru line formed therein. The active-matrix device includes at least one chiplet located over the substrate and including first, second, third, and control connection pads including; a control line electrically connecting the control connection pad to the control electrode; a first end of the discontinuous pass-thru line connected to the first connection pad and a second end of the discontinuous pass-thru line connected to the second connection pad; circuitry electrically connecting the first and second connection pads; and the continuous line electrically connected to the third connection pad, wherein the continuous line extends to opposite sides of the chiplet.

21 Claims, 3 Drawing Sheets

DISPLAY DEVICE WITH CHIPLETS

CROSS REFERENCE TO RELATED APPLICATION

Reference is made to U.S. patent application Ser. No. 12/191,478 filed Aug. 14, 2008.

FIELD OF THE INVENTION

The present invention relates to display devices having a substrate with distributed, independent control elements and, in particular, optimal arrangements of such control elements over the substrate.

BACKGROUND OF THE INVENTION

Flat-panel display devices are widely used in conjunction with computing devices, in portable devices, and for entertainment devices such as televisions. Such displays typically employ a plurality of pixels distributed over a substrate to display images. Each pixel incorporates several, differently colored light-emitting elements commonly referred to as sub-pixels, typically emitting red, green, and blue light, to represent each image element. A variety of flat-panel display technologies are known, for example plasma displays, liquid crystal displays, and light-emitting diode displays. Active-matrix elements are not necessarily limited to displays and can be distributed over a substrate and employed in other applications requiring spatially distributed control.

Light emitting diodes (LEDs) incorporating thin films of light-emitting materials forming light-emitting elements have many advantages in a flat-panel display device and are useful in optical systems. U.S. Pat. No. 6,384,529 issued May 7, 2002 to Tang et al. shows an organic LED color display that includes an array of organic LED light-emitting elements. Alternatively, inorganic materials can be employed and can include phosphorescent crystals or quantum dots in a poly-crystalline semiconductor matrix. Other thin films of organic or inorganic materials can also be employed to control charge injection, transport, or blocking to the light-emitting-thin-film materials, and are known in the art. The materials are placed upon a substrate between electrodes, with an encapsulating cover layer or plate. Light is emitted from a pixel when current passes through the light-emitting material. The frequency of the emitted light is dependent on the nature of the material used. In such a display, light can be emitted through the substrate (a bottom emitter) or through the encapsulating cover (a top emitter), or both.

LED devices can comprise a patterned light-emissive layer wherein different materials are employed in the pattern to emit different colors of light when current passes through the materials. Alternatively, one can employ a single emissive layer, for example, a white-light emitter, together with color filters for forming a full-color display, as is taught in U.S. Pat. No. 6,987,355 entitled, "Stacked OLED Display having Improved Efficiency" by Cok. It is also known to employ a white sub-pixel that does not include a color filter, for example, as taught in U.S. Pat. No. 6,919,681 entitled, "Color OLED Display with Improved Power Efficiency" by Cok et al. A design employing an unpatterned white emitter has been proposed together with a four-color pixel comprising red, green, and blue color filters and sub-pixels and an unfiltered white sub-pixel to improve the efficiency of the device (see, e.g. U.S. Pat. No. 7,230,594 issued Jun. 12, 2007 to Miller, et al).

Two different methods for controlling the pixels in a flat-panel display device are generally known: active-matrix and passive-matrix control. In an active-matrix device, control elements are distributed over the flat-panel substrate. Typically, each sub-pixel is controlled by one control element and each control element includes at least one transistor. For example, in a simple active-matrix organic light-emitting (OLED) display, each control element includes two transistors (a select transistor and a power transistor) and one capacitor for storing a charge specifying the brightness of the sub-pixel. Each light-emitting element typically employs an independent control electrode and a common electrode.

Prior-art active-matrix control elements typically comprise thin-film semiconductor materials, such as silicon, formed into transistors and capacitors through photolithographic processes. The thin-film silicon can be either amorphous or polycrystalline. Thin-film transistors made from amorphous or polycrystalline silicon are relatively larger and have lower performance than conventional transistors made from crystalline silicon wafers. Moreover, such thin-film devices typically exhibit local or large-area non-uniformity that results in perceptible non-uniformity in a display employing such materials. While improvements in manufacturing and materials processes are made, the manufacturing processes are expensive and thin-film device performance continues to be lower than the performance of crystalline silicon devices.

Matsumura et al describe one prior-art description of crystalline silicon substrates used with LCD displays in U.S. Patent Application 2006/0055864. The application describes a method for selectively transferring and affixing pixel-control devices made from first semiconductor substrates onto a second planar display substrate. Wiring interconnections within the pixel-control device and connections from busses and control electrodes to the pixel-control device are shown. However, there is no teaching of optimizing the aperture ratio of a display or minimizing the cost of such pixel-control devices in cooperation with a display device.

There still remains a need, therefore, for an improved method for controlling light-emitting or light-responsive elements in an active-matrix device and, in particular, for light-emissive displays.

SUMMARY OF THE INVENTION

The need is met in one embodiment of the present invention by a display device, comprising:
  a) a substrate;
  b) one or more pixels arranged on the substrate, each pixel including a control electrode;
  c) a wiring layer located over the substrate, the wiring layer having a continuous line and a discontinuous pass-thru line formed therein; and
  d) at least one chiplet located over the substrate and including first, second, third, and control connection pads including;
    i) a control line electrically connecting the control connection pad to the control electrode;
    ii) a first end of the discontinuous pass-thru line connected to the first connection pad and a second end of the discontinuous pass-thru line connected to the second connection pad;
    iii) circuitry electrically connecting the first and second connection pads; and
    iv) the continuous line electrically connected to the third connection pad, wherein the continuous line extends to opposite sides of the chiplet.

ADVANTAGES

The present invention has the advantage that it improves the performance of control elements in a flat-panel substrate, decreases costs, and increases the panel-aperture ratio.

DETAILED DESCRIPTION OF THE INVENTION

Figure 1A:
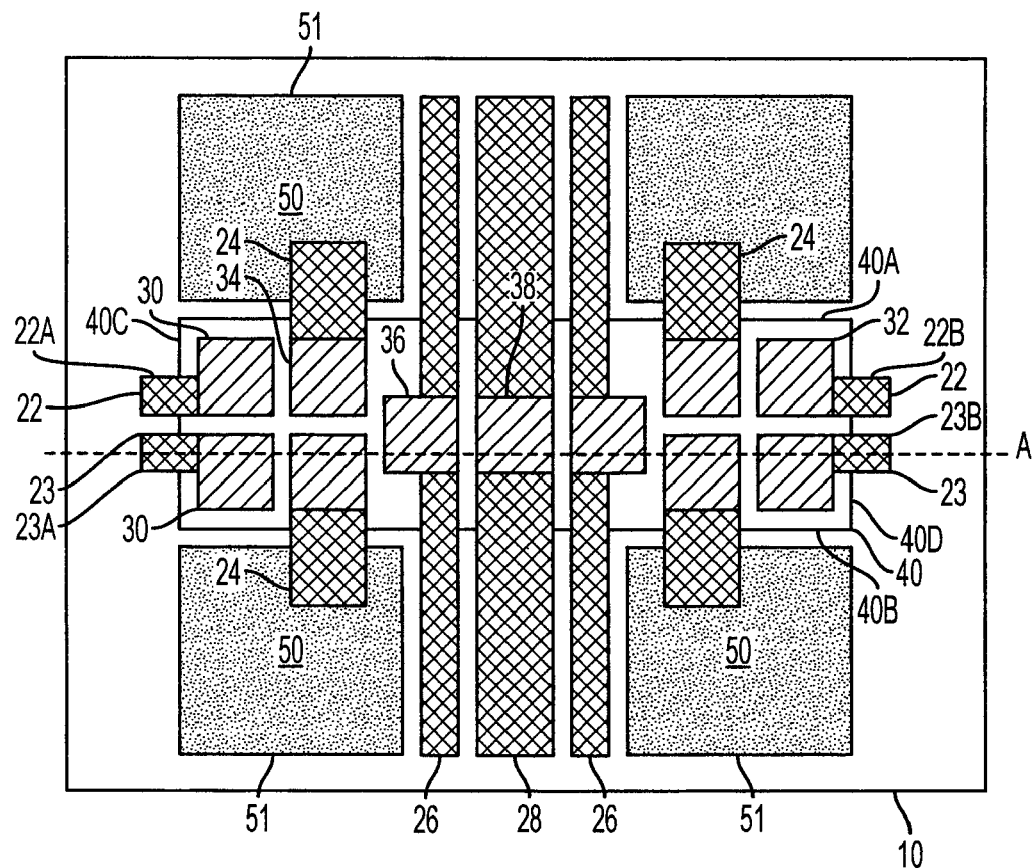
FIG. 1A is a plan view of a portion of a substrate with a control element according to an embodiment of the present invention.

Referring to FIG. 1A in a plan view and FIG. 1 B in a cross section taken through line A of FIG. 1A, according to an embodiment of the present invention, an active-matrix device includes a substrate 10 and one or more pixels 50 arranged on the substrate 10. Each pixel 50 includes a control electrode 51. A wiring layer 20 is located over and largely parallel to the substrate 10, the wiring layer 20 having continuous lines 26, 28 and discontinuous pass-thru lines 22, 23 formed therein. The control electrodes 51 can be in the wiring layer 20 or alternatively, can be in a layer separate from the wiring layer 20.

At least one chiplet 40 is located over the substrate 10 and includes circuitry 42, 44, first connection pads 30, second connection pads 32, third connection pads 36, 38, and control connection pads 34. Control lines 24 electrically connect control connection pads 34 to the control electrodes 51 of pixels 50. One end 22A, 23A of the discontinuous pass-thru lines 22, 23 is connected to first connection pads 30 and a second end 22B, 23B of the discontinuous pass-thru lines 22, 23 line is connected to the second connection pads 32. The circuitry 42, 44 electrically connects the first connection pad 30 and second connection pad 32 The continuous lines 26, 28 are electrically connected to the third connection pad 36, 38 wherein the continuous lines extend to opposite long sides 40A, 40B of the chiplet 40. Continuous lines 26, 28 and pass-thru lines 22, 23 may be employed as power busses or control signals, for example power and ground busses or data and select signals.

As used herein, a pixel is any light-emitting or light-responsive element on a substrate. For example, in one embodiment of the present invention, a single organic or inorganic light-emitting diode element emitting light of any color and formed over a substrate is a pixel as intended herein. The terms "pixel", "sub-pixel", or light-emitting element or light-responsive element all refer to a pixel as used herein. Arrays of such light-emissive pixels can be found in displays. In an alternative embodiment of the present invention, a light-responsive element, for example a light-sensitive diode or light-sensitive transistor, can be a pixel. Arrays of such light-sensitive pixels can be found in image sensors or solar cells. The pixels typically comprise a pair of electrodes formed on either side of a light-emissive or light-responsive material. In some embodiments (e.g. displays), one electrode is electrically connected in common and is unpatterned over the active area of the substrate while the second control electrode 51 is formed only over the active area of each pixel 50.

The wiring layer 20 is largely parallel to the substrate 10. By largely parallel is meant that the distance between the wiring layer 20 and the substrate 10 can vary somewhat over the substrate area but that the average distance between the wiring layer 20 and the substrate 10 is uniform for areas of one or several pixels in size. The pass-thru lines (e.g. 22, 23) are described as discontinuous. As intended herein, the pass-thru lines are physically discontinuous in the wiring layer 20, that is, they form a series of line segments. However, the pass-thru line segments in the wiring layer 20 are electrically continuous since they are electrically connected through the connection pads 30, 32 and the circuitry 44 in the chiplet 40.

An active-matrix device, as intended herein, is a device including a plurality of distributed control elements, for example an array of thin-film control circuits formed over a substrate wherein each control circuit is responsive to control signals and power busses to control a light-emitting element. However, according to the present invention, the distributed control elements are chiplets. A chiplet is a relatively small integrated circuit compared to the substrate 10 and includes a circuit including wires, connection pads, passive components such as resistors or capacitors, or active components such as transistors or diodes, formed on an independent substrate. Chiplets are separately manufactured from the display substrate and then applied to the display substrate. The chiplets are preferably manufactured using silicon or silicon on insulator (SOI) wafers using known processes for fabricating semiconductor devices. Each chiplet is then separated prior to attachment to the display substrate. The crystalline base of each chiplet can therefore be considered a substrate separate from the device substrate and over which the chiplet's circuitry is disposed. The plurality of chiplets 40 therefore has a corresponding plurality of substrates separate from the device substrate 10 and each other. In particular, the independent substrates are separate from the substrate 10 on which the pixels are formed and the areas of the independent, chiplet substrates, taken together, are smaller than the device substrate 10. Chiplets can have a crystalline substrate to provide higher performance active components than are found in, for example, thin-film amorphous or polycrystalline silicon devices. Chiplets can have a thickness preferably of 100 um or less, and more preferably 20 um or less. This facilitates formation of the adhesive and planarization material 12 over the chiplet that can then be applied using conventional spin-coating techniques. According to one embodiment of the present invention, chiplets formed on crystalline silicon substrate are arranged in a geometric array and adhered to a substrate (e.g. 10) with adhesion or planarization materials 12. Connection pads 30, 32, 34, 36, 38 on the surface of the chiplets 40 are employed to connect each chiplet 40 to control signal and power busses using pass-thru and continuous lines 22, 23, 26, 28 and to drive pixels 50 through control-line wires 24 formed over the substrate 10. Chiplets 40 can control one, several, or many pixels 50. However, it is preferred that each chiplet 40 control at least two pixels 50.

Since the chiplets 40 are formed in a semiconductor substrate, the circuitry of the chiplet can be formed using modern lithography tools. With such tools, feature sizes of 0.5 microns or less are readily available. For example, modern semiconductor fabrication lines can achieve line widths of 90 nm or 45 nm and can be employed in making the chiplets of the present invention. Therefore, the circuitry of the chiplet for driving the pixels, such as the two transistors for each pixel, can be made small. The chiplet, however, also requires connection pads for making electrical connection to the wiring layer provided over the chiplets once assembled onto the display substrate. The connection pads must be sized based on the feature size of the lithography tools used on the display substrate (for example 5 um) and the alignment of the chiplets to the wiring layer (for example +/−5 um). Therefore, the connection pads can be, for example, 15 um wide with 5 um spaces between the pads. This means that the pads will generally be significantly larger than the transistor circuitry formed in the chiplet.

The pads can generally be formed in a metallization layer on the chiplet over the transistors. It is desirable to make the chiplet with as small a surface area as possible to enable a low manufacturing cost. Therefore, the size and number of the connection pads and not the transistors will generally limit the size of the chiplet.

Figure 1B:
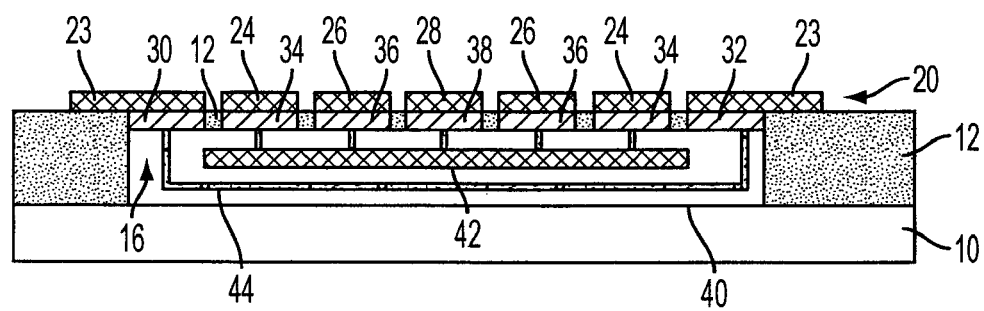
FIG. 1B is a cross section of a portion of a substrate with a control element shown in FIG. 1A according to an embodiment of the present invention.

The present invention is particularly advantaged when the size of the chiplet 40 is limited by the size and number of the connection pads 30, 32, 34, 36, and 38. When this is the case, the chiplet 40 cannot be reduced in size without reducing the number of connection pads, the size of the connection pads, or the design rules limiting the spacing of the connection pads. For example, as shown in FIGS. 1A and 1B, reducing the circuitry 42, 44, cannot reduce the chiplet 40 in size.

The present invention is also advantaged when a single wiring layer 20 is provided for the pass-thru and continuous lines 22, 23, 26, 28 connected to the first and second connection pads, 30, 32, and third connection pads 36, 38. By providing a single wiring layer, for example, photolithographic steps used to pattern the pass-thru and continuous lines 22, 23, 26, 28 are reduced and cost is likewise reduced. The use of multiple layers of metal for multiple wiring layers increases patterning costs and requires the formation of vias. It can also be useful, but not necessary, to pattern the control lines 24 and control electrodes 51 in the same wiring layer 20.

It can also be useful to minimize the thickness of the chiplets 40. The chiplets 40 are typically affixed to the substrate 10 with an adhesive and overcoated by planarizing layer 12. The planarization layer serves to smooth the device topography at the edge of the chiplets. If the step height at the edge of the chiplet is too larger or too sharp, the wiring layer may not form in a continuous fashion resulting in open circuit defects. However, the thickness of useful planarizing layers 12 can be limited by their viscosity and deposition technology (e.g. spin coating or spraying), thereby restricting the thickness of the chiplet 40 or subsequent processing over the chiplet 40. If the planarizing layer 12 is too thin, the wires (e.g. pass-thru and continuous lines 22, 23, 26, 28) in the wiring layer can directly short together or indirectly short through the chiplet 40 itself A useful chiplet 40 thickness is 20 microns or less enabling commercially available materials (e.g. benzocyclobutene) to effectively adhere, encapsulate, and planarize the chiplet 40. Vias 16 can be formed in the planarizing adhesive to enable electrical connections between the connection pads 30, 32, 34, 36, 38 and the pass-thru, control and continuous lines 22, 23, 24, 26, 28 in wiring layer 20.

The wiring layer 20 is shown in the preferred arrangement formed over both the chiplet 40 and substrate 10. This arrangement facilitates forming high-quality electrical connections between the wiring layer 20 and the chiplet 40. In one embodiment, this single wiring layer serves to provide all the required pass-thru, control, and continuous lines 22, 23, 24, 26, 28 in both the horizontal (row) and vertical (column) directions. As such, multiple wiring layers are not required and cost of producing the display device reduced. Alternatively, the wiring layer 20 can be located between the chiplet 40 and the substrate 10. Such embodiments can be useful in forming, for example, top- or bottom-emitting display devices.

Figure 2:
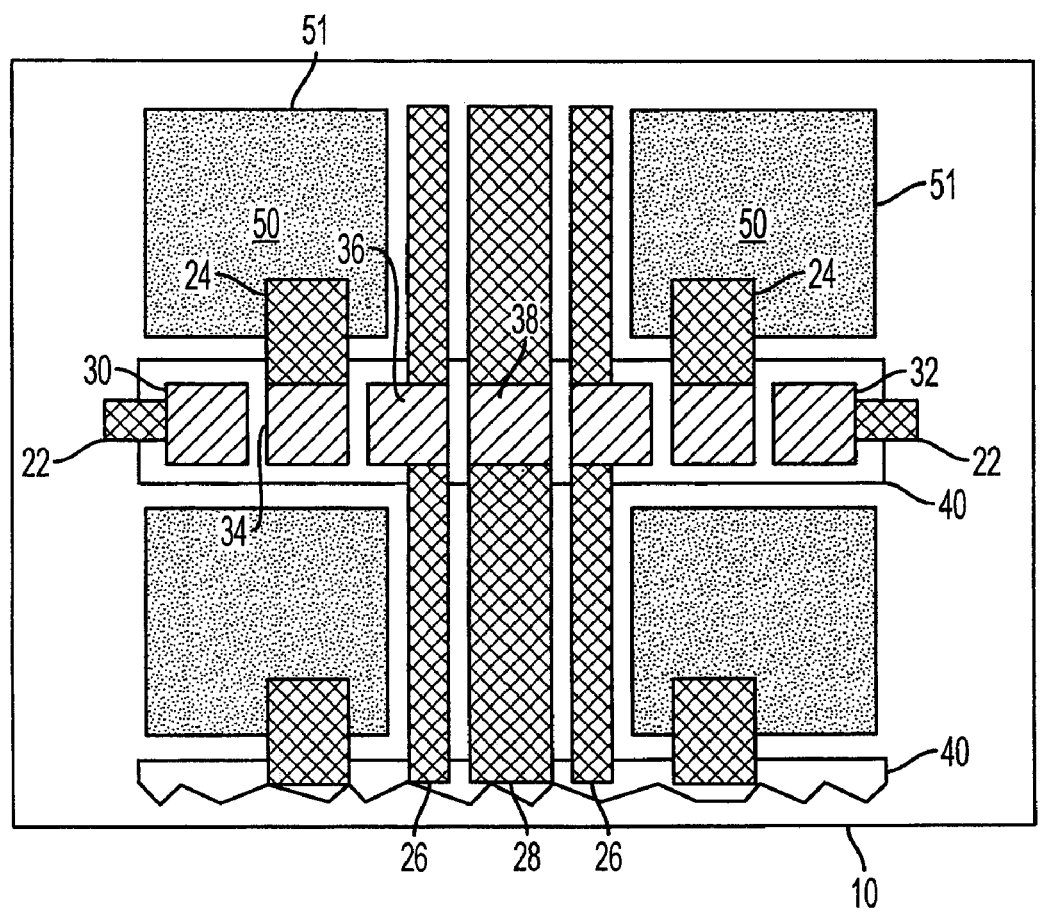
FIG. 2 is a plan view of a portion of a substrate with a control element according to an alternative embodiment of the present invention.

In one convenient embodiment of the present invention, the pixels 50 are formed in a regular, rectangular array over the substrate 10. The pass-thru lines 22, 23 can be orthogonal to the continuous lines 26, 28. The chiplets 40 can have a high-aspect ratio, i.e. adjacent sides have very different lengths. In such high-aspect ratio embodiments, the chiplet 40 is rectangular and has two opposing and relatively long sides 40A and 40B and two corresponding opposing and relatively short sides 40C and 40D defining long and short dimensions respectively. In one embodiment of the present invention and as illustrated in FIGS. 1A and 1B, the discontinuous pass-thru lines 22, 23 can be aligned with the long dimension of the chiplet 40 (that is the long side and the discontinuous pass-thru lines 22, 23 have their greatest length in the same dimension). Furthermore, as illustrated in FIGS. 1A and 1B, the continuous lines 26, 28, can be aligned with the short dimension of the chiplet 40 (that is the short side and the continuous lines 26, 28 have their greatest length in the same dimension). Moreover, as illustrated in FIGS. 1A and 1B, the chiplet 40 can be oriented over the substrate 10 so that the third connection pad 36, 38 is closer to the center of the chiplet 40 than to the short sides, the third connection pad 38 is at the center of the chiplet 40 in either the short or long dimensions, or the third connection pad 38 is at the center of the chiplet 40 in both the short and long dimensions (FIG. 2). In either case, the control connection pad 34 can be between the first and third connection pads 30, 38 or between the second and third connection pads 32, 38.

In this embodiment, an electrical connection is maintained between the first and second connection pads 30, 32 by circuitry 44, for example a wire or metal layer in the chiplet 40, thereby maintaining the electrical continuity of the pass-thru lines 22, 23. In order to simplify the pass-thru line layout, the first connection pad 30 can be as close as or closer than any other connection pad (e.g. 34, 36, 38) to one of the short side 40C and the second connection pad 32 can be as close as or closer than any other connection pad (e.g. 34, 36, 38) to the other of the short side 40D (as illustrated in FIGS. 1A and 1B).

A variable number of lines can be employed in a device of the present invention. As illustrated in FIGS. 1A and 1B, two pass-thru lines 22, 23 and three continuous lines 26, 28 are employed, for example providing select and data signals and a power connection as are found in conventional thin-film active-matrix circuits. However, any number greater than zero of either discontinuous or continuous lines can be employed. In one useful embodiment of the present invention, the number of discontinuous lines is equal to the number of continuous lines. Such an arrangement can provide improved addressing capability. Alternatively, the number of pass-thru lines can be less than or equal to the number of continuous lines. Such an arrangement can minimize the size of the chiplet when the number, size, and spacing of the connection pads, as discussed above, limits the size of the chiplet. It is particularly useful to employ one of the continuous lines as a power buss, to reduce voltage drops through connection pads or within a chiplet and thereby enhance device electrical power distribution uniformity. Power busses are lines that provide a source of electrical current to the light-emitting elements from an external power source during operation of the display. As such, power busses must be able to efficiently deliver relatively large amounts of current compared to other types of lines. The other continuous signal line(s) can carry a data control signal and the pass-thru line can carry a select control signal or, alternatively, the continuous lines can carry a select control signal and the pass-thru lines can carry a data control signal. Select control signals are lines that activate a row of pixels and data control signals are lines that carry brightness information to the pixels. Select and data control signals are therefore arranged in orthogonal directions. An arrangement using pass-thru lines employs metal connections in the chiplet to enable this orthogonal arrangement and simultaneously avoids the need for multiple wiring layers. To assist in robust construction, lines, especially continuous lines, may have multiple or larger connection pads (e.g. connection pads 36, 38 may be larger or replicated in the connection pad rows in FIG. 1A).

As illustrated in FIGS 1A and 1B, the chiplet 40 has only two connection pads in the short dimension forming two rows of connection pads in the long dimension. In an alternative embodiment shown in FIG. 2, the chiplet can have only one connection pad in the short dimension forming one row of connection pads in the long dimension. (FIG. 2 illustrates a portion of a second such chiplet at the bottom of the figure.) In alternative embodiments, the single row could have more control connection pads, for example nine connection pads with four control connection pads could be employed providing connections to four pixels.)

The present invention provides a distributed-control device with improved performance. By employing chiplets with independent substrates (e.g. comprising crystalline silicon) having circuitry with higher performance than circuits formed directly on the substrate (e.g. amorphous or polycrystalline silicon), a device with higher performance is provided. Since crystalline silicon has not only higher performance but much smaller active elements (e.g. transistors), the circuitry size is much reduced so that the chiplet size is determined by the number and spacing of connection pads necessary to control and power the device. A useful chiplet can also be formed using micro-electro-mechanical (MEMS) structures, for example as described in "A novel use of MEMs switches in driving AMOLED", by Yoon, Lee, Yang, and Jang, Digest of Technical Papers of the Society for Information Display, 2008, 3.4, p. 13.

According to the present invention, by providing discontinuous pass-thru lines routed through the chiplet and continuous lines in an orthogonal direction, the size and cost of the chiplet are reduced as well as the complexity of the wiring. Furthermore, the aperture ratio of the device can be improved, increasing efficiency and lifetime. By enabling a device having a single wiring layer, costs are further reduced.

Figure 3:
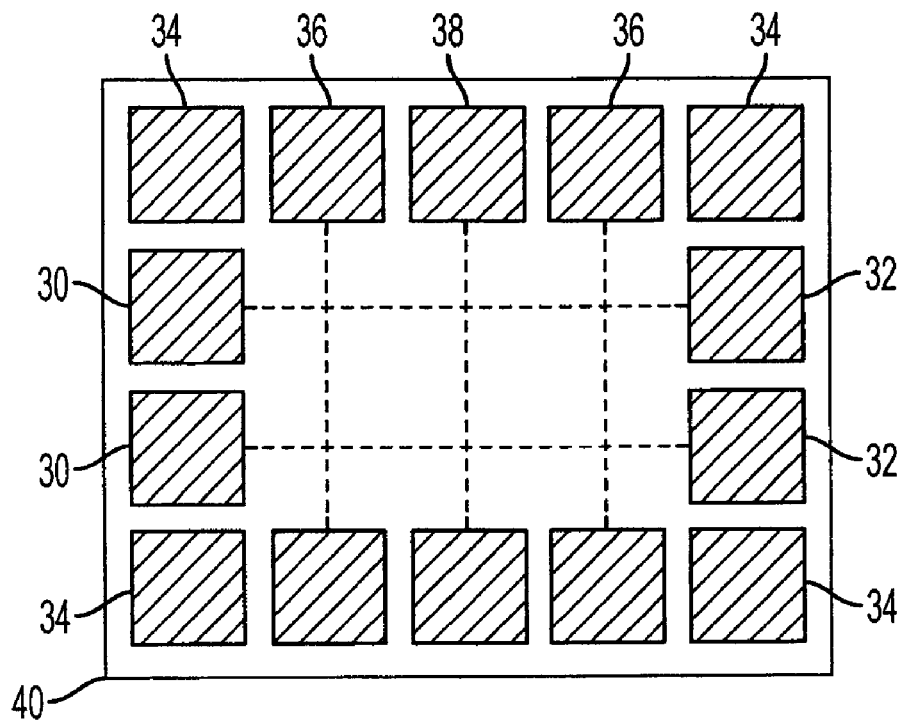
FIG. 3 is a plan view of control element with one alternative layout to that of FIG. 1A.
Figure 4:
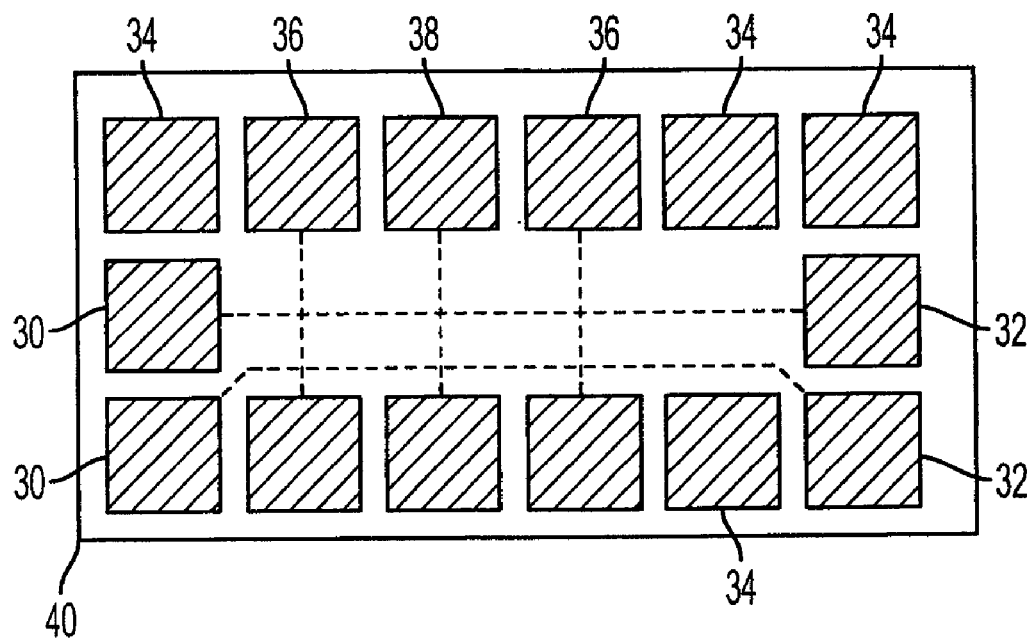
FIG. 4 is a plan view of control element with a second alternative layout to that of FIG. 1A.

The table below illustrates the advantages of the present invention compared to alternative solutions proposed in the prior art. Calculations presume connection pads having a size four with a spacing of one, in arbitrary units. Design A (present invention) employs three continuous lines (e.g. one power buss and two data control signals), two pass-thru lines (e.g. select control signals), and four control lines as illustrated in FIG. 1A (with 11 connection pads). Note that the connection pads for the continuous lines 36, 38 could be larger without changing the chiplet size. As suggested in the prior art, design B employs connection pads located on the perimeter of the chiplet (FIG. 3) and does not presume any continuous lines. Design C (FIG. 4) uses an alternative aspect ratio to that of Design B. With these parameters, for each dimension:

$$\text{Total Pad Width} = \text{\#pads} \times 4 \qquad \text{Eqn 1:}$$

$$\text{Total Spacing Width} = \text{\#pads} + 1 \qquad \text{Eqn 2:}$$

$$\text{Total Width} = \text{Total Pad Width} + \text{Total Spacing Width} \qquad \text{Eqn 3:}$$

$$\text{Total Area} = \text{Total Width(Long Dimension)} \times \text{Total Width(Short Dimension)} \qquad \text{Eqn 4:}$$

TABLE 1

Example 1

| Design | Total Pad Width | Total Spacing Width | Total Width | Total Area |
|---|---|---|---|---|
| A (Inventive) | | | | 396 |
| Long dimension | 28 | 8 | 36 | |
| Short dimension | 8 | 3 | 11 | |
| B | | | | 546 |
| Long dimension | 20 | 6 | 26 | |
| Short dimension | 16 | 5 | 21 | |
| C | | | | 496 |
| Long dimension | 24 | 7 | 31 | |
| Short dimension | 12 | 4 | 16 | |

In a second example, a design employing two continuous lines (e.g. one power and one data line), two pass-thru lines (e.g. select lines), and four control lines (10 connection pads) is compared to alternatives similar to those of Example 1.

TABLE 2

Example 2

| Design | Total Pad Width | Total Spacing Width | Total Width | Total Area |
|---|---|---|---|---|
| A (Inventive) | | | | 341 |
| Long dimension | 24 | 7 | 31 | |
| Short dimension | 8 | 3 | 11 | |
| B | | | | 441 |
| Long dimension | 16 | 5 | 21 | |
| Short dimension | 16 | 5 | 21 | |
| C | | | | 416 |
| Long dimension | 20 | 6 | 26 | |
| Short dimension | 12 | 4 | 16 | |

In a third example, the inventive design of FIG. 2 is compared to alternatives similar to those of the previous two examples.

TABLE 3

Example 3

| Design | Total Pad Width | Total Spacing Width | Total Width | Total Area |
|---|---|---|---|---|
| A (Inventive) | | | | 216 |
| Long dimension | 28 | 8 | 36 | |
| Short dimension | 4 | 2 | 6 | |
| B | | | | 286 |
| Long dimension | 20 | 6 | 26 | |
| Short dimension | 8 | 3 | 11 | |

As can be seen from the tables, a design employing a combination of pass-thru lines and continuous lines as claimed in the present invention provides reduced area for the chiplet. Moreover, the line routing is often simplified, improving the aperture ratio of the device in some embodiments, e.g. bottom-emitter. By using a high-aspect ratio design with pass-thru connection pads only closest to the ends in the long dimension of the chiplet, layout efficiency is further optimized and costs reduced.

The substrate 10 can comprise glass and the wiring layers made of evaporated or sputtered metal, e.g. aluminum or silver, formed over a planarization layer (e.g. resin) patterned with photolithographic techniques known in the art. The chiplets 40 can be formed using conventional techniques well established in the integrated circuit industry.

In one light-emitting embodiment, the present invention can operate as follows. The chiplet 40 active-matrix control elements contain circuitry (e.g. 42, 44) including charge-storage elements (e.g. capacitors), active elements (e.g. transistors) responsive to signals for charge deposition in the charge-storage elements, a power buss, and drive elements for controlling current or voltage from the power buss. Drive elements (e.g. power transistors) respond to the charge-storage elements to drive current through the control lines. Such circuits are known in the art, for example to drive organic or inorganic light-emitting diode devices. Referring to FIG. 1A, lines 22, 23, 26, (e.g. data and select control signals) are provided with signals to deposit charge in the charge-storage element. The drive transistor responds to the charge-storage element to drive current through the control lines 24 to the control electrode 51 and pixel 50. Useful signal and control methods are known in the art. Such an operation can be useful in, for example, organic or inorganic LED display devices.

In an alternative light-responsive embodiment, the present invention can operate as follows. The pixels can include light-sensitive diodes or transistors. The chiplet 40 active-matrix control elements contain circuitry connected to control signals and power busses. When the light-sensitive diode or transistor of the pixel is exposed to light, current passes through lines to the chiplet 40 and can be stored in charge-storage elements (e.g. capacitors). The charge can then be transferred through lines to an external controller. Useful signal and control methods are known in the art. Such an operation can be useful in, for example, large-area image-sensing applications.

The present invention can be employed in devices requiring an active-matrix infrastructure. The present invention provides advantages when an increased aperture ratio, improved active-matrix performance, and decreased costs are important. In particular, the present invention can be practiced with active-matrix LED devices, either organic or inorganic, and is particularly useful in information-display devices. In a preferred embodiment, the present invention is employed in a flat-panel OLED device composed of small-molecule or polymeric OLEDs as disclosed in, but not limited to U.S. Pat. No. 4,769,292, issued Sep. 6, 1988 to Tang et al., and U.S. Pat. No. 5,061,569, issued Oct. 29, 1991 to VanSlyke et al. Inorganic devices, for example, employing quantum dots formed in a polycrystalline semiconductor matrix (for example, as taught in US Publication 2007/0057263 by Kahen), and employing organic or inorganic charge-control layers, or hybrid organic/inorganic devices can be employed. Many combinations and variations of organic or inorganic light-emitting displays can be used to fabricate such a device, including active-matrix displays having either a top- or a bottom-emitter architecture.

The invention has been described in detail with particular reference to certain preferred embodiments thereof, but it should be understood that variations and modifications can be effected within the spirit and scope of the invention.

PARTS LIST

| | |
|---|---|
| A | cross section line |
| 10 | substrate |
| 12 | adhesive and planarization layer |
| 16 | via |
| 20 | wiring layer |
| 22 | pass-thru line |
| 23 | pass-thru line |
| 22A | end |
| 22B | end |
| 23A | end |
| 23B | end |
| 24 | control line |
| 26 | continuous line |
| 28 | continuous line |
| 30 | first connection pad |
| 32 | second connection pad |
| 34 | control connection pad |
| 36 | third connection pad |
| 38 | third connection pad |
| 40 | chiplet |
| 40A | long side |
| 40B | long side |
| 40C | short side |
| 40D | short side |
| 42 | circuitry |
| 44 | circuitry |
| 50 | pixel |
| 51 | control electrode |

What is claimed is:

1. A display device, comprising:
a substrate;
one or more pixels arranged on the substrate, each pixel including a control electrode;
a wiring layer located over the substrate, the wiring layer having a continuous line and a discontinuous pass-thru line formed therein; and
at least one chiplet located over the substrate and including first, second, third, and control connection pads including:
a control line electrically connecting the control connection pad to the control electrode;
a first end of the discontinuous pass-thru line connected to the first connection pad and a second end of the discontinuous pass-thru line connected to the second connection pad;
circuitry electrically connecting the first and second connection pads; and
the continuous line electrically connected to the third connection pad, wherein the continuous line extends to opposite sides of the chiplet and wherein the at least one chiplet has a rectangular shape having two opposing short sides and two opposing long sides.

2. The active-matrix device of claim 1, wherein the size of the chiplet is limited by the size and number of the connection pads.

3. The active-matrix device of claim 1, further comprising bus lines for signal and power distribution and wherein all of the bus lines are formed within the wiring layer.

4. The active-matrix device of claim 1, wherein the chiplet has a thickness of less than 20 microns.

5. The active-matrix device of claim 1, wherein the pass-thru lines are aligned with the long dimension of the chiplet.

6. The active-matrix device of claim 1, wherein the chiplet is oriented over the substrate so that the first connection pad is as close as, or closer than, any other connection pad to one of the short sides and the second connection pad is as close as or closer than any other connection pad to the other of the short sides.

7. The active-matrix device of claim 1, wherein the chiplet is oriented over the substrate so that the continuous lines are aligned with the short dimension of the chiplet.

8. The active-matrix device of claim 1, wherein the chiplet is oriented over the substrate so that the third connection pad is closer to the center of the chiplet than to the short sides, the third connection pad is at the center of the chiplet in either the short or long dimensions, or the third connection pad is at the center of the chiplet in both the short and long dimensions.

9. The active-matrix device of claim 1, wherein the number of pass-thru lines is less than or equal to the number of continuous lines.

10. The active-matrix device of claim 1, wherein the chiplet has only two connection pads in the short dimension forming two rows of connection pads in the long dimension.

11. The active-matrix device of claim 1, wherein the chiplet has only one connection pad in the short dimension forming one row of connection pads in the long dimension.

12. The active-matrix device of claim 1, wherein the pass-thru line is orthogonal to the continuous line.

13. The active-matrix device of claim 1, wherein the chiplet is located between the wiring layer and the substrate.

14. The active-matrix device of claim 1, wherein the wiring layer is located between the chiplet and the substrate.

15. The active-matrix device of claim 1, wherein the control connection pad is between the first and third connection pads or between the second and third connection pads.

16. The active-matrix device of claim 1, wherein one of the continuous lines is a power line.

17. The active-matrix device of claim 1, wherein the continuous line carries a data signal and the pass-thru line carries a select signal or wherein the continuous lines carries a select signal and the pass-thru lines carries a data signal.

18. The active-matrix device of claim 1, wherein the pixels comprise organic or inorganic light-emitting diodes, light-sensitive diodes, or light-sensitive transistors.

19. The active-matrix device of claim 1, wherein the control electrodes are in the wiring layer.

20. The active-matrix device of claim 1, wherein the control electrodes are in a different layer than the wiring layer.

21. The active-matrix device of claim 1, wherein the chiplet is oriented over the substrate so that the first connection pad is closer than any other connection pad to one of the short sides and the second connection pad is closer than any other connection pad to the other of the short sides.

* * * * *